United States Patent [19]

Sopori

[11] Patent Number: 5,426,061
[45] Date of Patent: Jun. 20, 1995

[54] IMPURITY GETTERING IN SEMICONDUCTORS

[75] Inventor: Bhushan L. Sopori, Denver, Colo.

[73] Assignee: Midwest Research Institute, Kansas City, Mo.

[21] Appl. No.: 301,559

[22] Filed: Sep. 6, 1994

[51] Int. Cl.⁶ .......................................... H01L 21/26
[52] U.S. Cl. ........................................ 437/11; 437/12; 437/173; 437/247
[58] Field of Search ................. 437/2, 10, 11, 12, 173, 437/937, 247, 939, 929, 174; 148/DIG. 125

[56] References Cited

U.S. PATENT DOCUMENTS

| | | | |
|---|---|---|---|
| 4,539,050 | 9/1985 | Kramler et al. | 437/11 |
| 4,840,918 | 6/1989 | Sheu et al. | 437/10 |
| 4,878,988 | 11/1989 | Hall et al. | 437/247 |
| 4,994,399 | 2/1991 | Aoki | 437/10 |
| 5,017,508 | 5/1991 | Dodt et al. | 437/10 |
| 5,051,375 | 9/1991 | Sakata et al. | 437/10 |
| 5,169,791 | 12/1992 | Muenzer | 437/13 |
| 5,179,029 | 1/1993 | Gottscho et al. | 437/10 |
| 5,198,371 | 3/1993 | Li | 437/11 |
| 5,244,819 | 9/1993 | Yue | 437/11 |
| 5,304,509 | 4/1994 | Sopori | 437/173 |

FOREIGN PATENT DOCUMENTS 0286460  11/1994  European Pat. Off. ............. 437/10

*Primary Examiner*—Olik Chaudhuri
*Assistant Examiner*—S. Mulpuri
*Attorney, Agent, or Firm*—Edna M. O'Connor

[57] ABSTRACT

A process for impurity gettering in a semiconductor substrate or device such as a silicon substrate or device. The process comprises hydrogenating the substrate or device at the back side thereof with sufficient intensity and for a time period sufficient to produce a damaged back side. Thereafter, the substrate or device is illuminated with electromagnetic radiation at an intensity and for a time period sufficient to cause the impurities to diffuse to the back side and alloy with a metal there present to form a contact and capture the impurities. The impurity gettering process also can function to simultaneously passivate defects within the substrate or device, with the defects likewise diffusing to the back side for simultaneous passivation. Simultaneously, substantially all hydrogen-induced damage on the back side of the substrate or device is likewise annihilated. Also taught is an alternate process comprising thermal treatment after hydrogenation of the substrate or device at a temperature of from about 500° C. to about 700° C. for a time period sufficient to cause the impurities to diffuse to the damaged back side thereof for subsequent capture by an alloying metal.

28 Claims, 1 Drawing Sheet

IMPURITY GETTERING IN SEMICONDUCTORS

The United States Government has rights in this invention under Contract No. DE ACO2-83CH10093 between the United States Department of Energy and the National Renewable Energy Laboratory, a division of the Midwest Research Institute.

BACKGROUND OF THE INVENTION

I. Field of the Invention

The present invention relates to a process for impurity gettering in a semiconductor substrate or device such as a silicon substrate or device by first hydrogenating the substrate or device and thereafter thermally treating the substrate or device or illuminating the substrate or device with electromagnetic radiation in a manner conducive to cause the impurities to diffuse to the back side of the substrate or device for subsequent capture.

II. Description of the Prior Art

Gettering processes for removing impurities from a semiconductor substrate or device such as silicon substrate or device used for microelectronic devices have included phosphorous diffusion, chlorine treatment as with trichloroethane, and thermal treatments following specific methods of substrate surface damage. With respect to specific types of surface damage, Kramler et al., in U.S. Pat. No. 4,539,050, describe a technique for creating back-side wafer damage by laser irradiation. The damaged back side acts as a gettering region, and the wafer is treated thermally to generate dislocation networks responsible for gettering action. Hall et al., in U.S. Pat. No. 4,878,988, describe a process in which sawing produces surface damage which acts to trap impurities. Following a high-temperature treatment, the damaged surface is lapped to remove the gettered impurities. Sakata et al., in U.S. Pat. No. 5,051,375, produces back-side silicon wafer damage by means of sand blasting using a spherical abrasive. The sand-blasted wafer is then oxidized at a high temperature to produce gettering of impurities to the damaged surface. Thus, prior-art gettering procedures generally involve either severe chemical or severe physical treatment of silicon substrate.

The introduction of hydrogen ions into silicon substrates as a technique for the passivation of defects present in the substrates is described in U.S. Pat. No. 5,169,791 to Muenzer and in U.S. Pat. No. 5,304,509, incorporated herein by reference in its entirety, to Sopori. Muenzer describes a thermal treatment consisting of annealing a silicon wafer in a hydrogen-containing gas such as a hydrogen-oxygen mixture (e.g. water vapor). This thermal treatment results in a reduction of the hydrogen gas to atomic hydrogen which, in turn, diffuses into the wafer to passivate crystal defects. Sopori describes a technique to introduce hydrogen from the back side of a solar cell for passivation of impurities and defects. Hydrogen diffusion within the cell occurs via formation and diffusion of a hydrogen-vacancy (H-V) complex. After low-energy hydrogen implantation, the cell undergoes sequential low-intensity and high-intensity optical processing to dissociate the H-V complex, to release hydrogen for passivation, and to alloy the back side of the cell and form a silicon-aluminum alloy which also partially dissolves hydrogen-induced damage on the back side. During optical processing, some hydrogen-induced defects are annihilated. It may be pointed out that in the back side hydrogenation process of Sopori, the presence of surface damage and the hydrogen-induced defects can produce deleterious effects on device performance. Hence, the process described in the Sopori patent is designed to minimize residual defects produced by hydrogenation.

While Sopori teaches hydrogenation of silicon substrates followed by optical processing under specific intensity magnitudes, the disclosure does not teach parameters for impurity gettering through the use of hydrogenation followed by thermal treatment or optical processing. Accordingly, a primary object of the present invention is to provide a process for impurity gettering in a semiconductor substrate or device such as a silicon substrate or device wherein a surface of the substrate or device is first subjected to hydrogen-induced damage consisting of dislocations and platelets, with the substrate or device thereafter exposed to electromagnetic radiation such that impurities within the substrate or device are caused to diffuse to the damaged surface for subsequent capture.

Another object of the present invention is to provide a process for impurity gettering in a semiconductor substrate or device such as a silicon substrate or device wherein a surface of the substrate or device is first subjected to hydrogen-induced damage, with the substrate or device thereafter exposed to thermal treatment such that impurities within the substrate or device are caused to diffuse to the damaged surface for subsequent capture.

Yet another object of the present invention is to provide a process for impurity gettering and defect passivation in a semiconductor substrate or device such as a silicon substrate or device wherein a surface of the substrate or device is first subjected to hydrogen-induced damage while hydrogen atoms are implanted into the substrate or device, with the substrate or device thereafter exposed to electromagnetic radiation such that impurities and defects within the substrate or device are caused to diffuse to the damaged surface while substantially all hydrogen-induced damage on the damaged surface is simultaneously annihilated.

These and other objects will become apparent throughout the description of the invention which now follows.

SUMMARY OF THE INVENTION

The present invention is a process for impurity gettering in a semiconductor substrate or device such as a silicon substrate or device. The process comprises, first, hydrogenating the substrate or device at the back side thereof with sufficient intensity and for a time period sufficient to produce a damaged back side and a preponderance of platelets. Thus, the objective is to maximize the generation of hydrogen-induced defects, and in particular a specific species of defects such as platelets since platelets are very efficient impurity sinks or gettering centers. Thereafter, the substrate or device is illuminated with electromagnetic radiation at an intensity and for a time period sufficient to cause the impurities to diffuse to the back side of the substrate or device and alloy with a metal there present to form a contact and capture the impurities.

The impurity gettering process employing electromagnetic radiation as here taught also can function to simultaneously passivate defects within the substrate or device since hydrogenation as here performed implants an amount of hydrogen atoms into the substrate or device to potentially passivate substantially all of the defects therein. When the substrate or device is subsequently illuminated with electromagnetic radiation at an intensity and for a time period sufficient to cause the impurities to diffuse to the back side of the substrate or device, the defects likewise diffuse to the back side for simultaneous passivation while substantially all hydrogen-induced damage on the back side of the substrate or device is likewise simultaneously annihilated.

Instead of illuminating the hydrogenated substrate or device to thereby achieve impurity gettering, an alternate process comprises thermal treatment of the substrate or device at a temperature of from about 500° C. to about 700° C. for a time period sufficient to cause the impurities to diffuse to the damaged back side thereof for subsequent capture. Typically, one hour is required for a 700° C. anneal; longer times are needed for lower temperatures.

The present impurity gettering process achieves surface damage by hydrogen ion implantation. Preferably, such hydrogenation is accomplished by directing a hydrogen ion beam toward the back side of the substrate or device. Gettering occurs primarily by platelet defects produced during the hydrogenation process, and these platelets are believed to be vacancy-related defects that have a propensity for "absorbing" or otherwise attracting metallic atoms such as iron, chromium, nickel and copper for gettering to the damaged surface of the substrate or device. Subsequent illumination treatment simultaneously drives the impurities to the damaged surface, passivates defects within the cell, and annihilates substantially all of the hydrogen-induced damage on the surface of the cell.

BRIEF DESCRIPTION OF THE DRAWINGS

The single drawing FIGURE is a graph showing electromagnetic radiation (optical power) per unit area versus time as typically representative for impurity gettering in a solar cell. The power density may be suitably increased for a substrate not having an anti-reflective coating.

DETAILED DESCRIPTION OF THE PREFERRED EMBODIMENT

Figure 1:
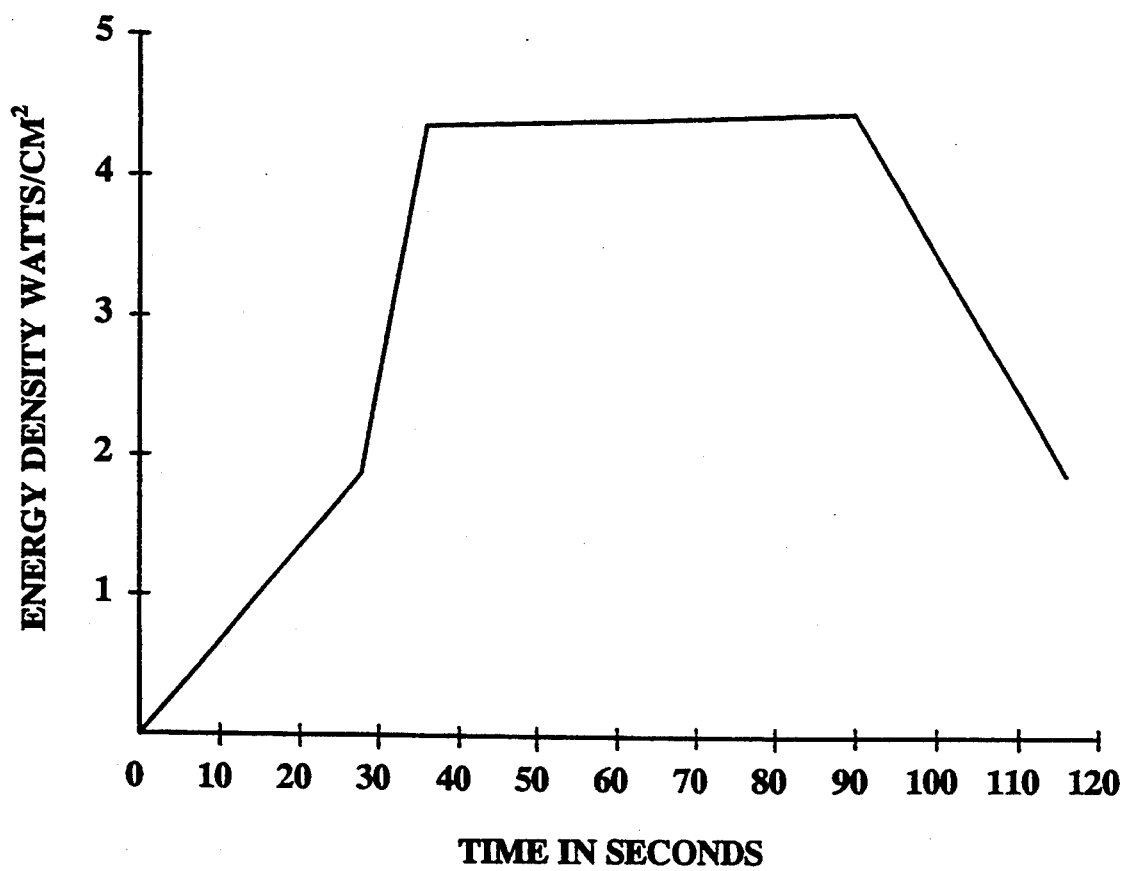

The preferred embodiment describes a gettering process for a silicon substrate solar cell. Standard processes are employed to fabricate the cell such that the cell includes an anti-reflective coating, front contact metallization, and either no back metal or a partially open gridded back. A low-energy hydrogen ion beam is generated by a conventional Kaufman ion source and is directed to the back side of the cell to implant hydrogen ions and produce surface damage. This hydrogenation of the cell is performed at a temperature of about 250° C. at <2 keV for about 30 minutes, and produces a damage layer preferably about 0.5-1 $\mu$m deep on the back side. Preferably a sufficient amount of hydrogen ions are implanted into the substrate or device to potentially passivate substantially all of the defects therein as well.

Although some gettering can occur during the hydrogenation process step, a second process step optimizes impurity diffusion and capture. One such second process step is that of illuminating the cell by electromagnetic radiation under a prescribed regimen. Specifically, the cell is continuously exposed to radiation wavelengths of from about 4000 Å to about 30,000 Å at an intensity of about 4-6 watts/cm$^2$ for about 70 seconds. Transmission electron microscopy (TEM) analysis of the resulting optically-processed cell clearly shows precipitation and capture of fast-diffusing impurities such as iron and nickel at the damaged back-side surface. Longer illumination times (typically up to about 300 seconds) can be expected for more extensive gettering and for gettering slower-diffusing impurities. This gettering step can be followed by deposition and alloying of an aluminum contact to dissolve the back surface which is rich in gettered impurities and may also have residual damage from hydrogenation. Because the solubilities of impurities in aluminum and Al—Si alloys are much higher that in silicon, the gettered impurities remain trapped at the back contact during such an alloying process. The illumination process thus acts to simultaneously drive impurities to the damaged surface, passivate defects within the cell, and annihilate substantially all of the hydrogen-induced damage on the surface of the cell.

Another such second process step is that of thermally annealing the hydrogenated cell at a temperature of from about 500° C. to about 700° C. for about 1-7 hours. Shorter times are needed if the dominant impurities in the substrate or device are fast-diffusers such as iron and chromium. As with optical processing, the thermal treatment also results in precipitation and capture of impurities at the damaged back-side surface. However, and as described above, impurity diffusion is tremendously enhanced by illumination, thus requiring much shorter process times as compared to thermal annealing. Whether followed by optical or thermal treatment, however, the present invention accomplishes effective hydrogen-induced gettering in semiconductor substrates or devices.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

I claim:
1. A process for impurity gettering in a semiconductor substrate or device having a front side and a back side and including a plurality of impurities, the process comprising the sequential steps of:
   a) hydrogenating the substrate or device at the back side thereof with sufficient intensity and for a time period sufficient to produce a damaged back side; and
   b) illuminating the substrate or device with electromagnetic radiation at an intensity and for a time period sufficient to cause the impurities to diffuse to the back side of the substrate or device and alloy with a metal attached there to and in which the impurities are soluble to form a contact without releasing said impurities.

2. A process as claimed in claim 1 wherein the metal is aluminum.

3. A process as claimed in claim 2 wherein the semiconductor substrate or device is a silicon substrate or device.

4. A process as claimed in claim 3 wherein hydrogenating the substrate or device is accomplished by directing a hydrogen ion beam toward the back side of the substrate or device.

5. A process as claimed in claim 4 wherein the intensity of the electromagnetic radiation transmitted into the substrate or device is about 4-6 watts/cm$^2$.

6. A process as claimed in claim 5 wherein the electromagnetic radiation has wavelengths from about 4000 Å to about 30,000 Å.

7. A process as claimed in claim 6 wherein the time period for illuminating the substrate or device is from about 70 seconds to about 300 seconds.

8. A process as claimed in claim 7 wherein a layer of damage of about 0.5-1 μm deep is provided to the back side.

9. A process as claimed in claim 8 wherein the intensity of the hydrogen beam is less than about 2 keV and the time period of hydrogenating the substrate or device is from about 25 minutes to about 35 minutes.

10. A process as claimed in claim 9 wherein said hydrogenating is performed at a temperature less than about 300° C.

11. A process for impurity gettering and defect passivation in a semiconductor substrate or device having a front side and a back side and including a plurality of impurities and defects, the process comprising the sequential steps of:
   a) hydrogenating the substrate or device at the back side thereof with sufficient intensity and for a time period sufficient to produce a damaged back side and to implant an amount of hydrogen atoms into the substrate or device to potentially passivate substantially all of the defects therein; and
   b) illuminating the substrate or device with electromagnetic radiation at an intensity and for a time period sufficient to cause the impurities and defects to diffuse to the back side of the substrate or device and alloy with a metal attached there to and in which the impurities are soluble to form a contact without releasing said impurities and to simultaneously passivate said defects and annihilate substantially all hydrogen-induced damage on said back side.

12. A process as claimed in claim 11 wherein the metal is aluminum.

13. A process as claimed in claim 12 wherein the semiconductor substrate or device is a silicon substrate or device.

14. A process as claimed in claim 13 wherein hydrogenating the substrate or device is accomplished by directing a hydrogen ion beam toward the back side of the substrate or device.

15. A process as claimed in claim 14 wherein the intensity of the electromagnetic radiation is about 4-6 watts/cm$^2$.

16. A process as claimed in claim 15 wherein the electromagnetic radiation has wavelengths from about 4000 Å to about 30,000 Å.

17. A process as claimed in claim 16 wherein the time period for illuminating the substrate or device is from about 70 seconds to about 300 seconds.

18. A process as claimed in claim 17 wherein a layer of damage of about 0.5-1 μm deep is provided to the back side.

19. A process as claimed in claim 18 wherein the intensity of the hydrogen beam is less than about 2 keV and the time period of hydrogenating the substrate or device is from about 25 minutes to about 35 minutes.

20. A process as claimed in claim 19 wherein said hydrogenating is performed at a temperature less than about 300° C.

21. A process for impurity gettering in a semiconductor substrate or device having a front side and a back side and including a plurality of impurities, the process comprising the sequential steps of:
   a) hydrogenating the substrate or device at the back side thereof with sufficient intensity and for a time period sufficient to produce a damaged back side; and
   b) thermally treating the substrate or device at a temperature of from about 500° C. to about 700° C. for a time period sufficient to cause the impurities to diffuse to the back side of the substrate or device and alloy with a metal attached there to and in which the impurities are soluble to form a contact without releasing said impurities.

22. A process as claimed in claim 21 wherein the metal is aluminum.

23. A process as claimed in claim 22 wherein the semiconductor substrate or device is a silicon substrate or device.

24. A process as claimed in claim 23 wherein hydrogenating the substrate or device is accomplished by directing a hydrogen ion beam toward the back side of the substrate or device.

25. A process as claimed in claim 24 wherein a layer of damage of about 0.5-1 μm deep is provided to the back side.

26. A process as claimed in claim 25 wherein the intensity of the hydrogen beam is less than about 2 keV and the time period for hydrogenating the substrate or device is from about 25 minutes to about 35 minutes.

27. A process as claimed in claim 26 wherein said hydrogenating is performed at a temperature less than about 300° C.

28. A process as claimed in claim 27 wherein the time period for thermally treating the substrate or device is about 1-7 hours.

* * * * *